(12) United States Patent
van der Wagt et al.

(10) Patent No.: US 6,490,193 B1
(45) Date of Patent: Dec. 3, 2002

(54) FORMING AND STORING DATA IN A MEMORY CELL

(75) Inventors: Jan Paul van der Wagt, Newbury Park, CA (US); Gerhard Klimeck, Glendale, CA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/938,027

(22) Filed: Aug. 22, 2001

(51) Int. Cl.$^7$ .............................................. G11C 11/00
(52) U.S. Cl. ..................................... 365/159; 365/175
(58) Field of Search ............................. 365/159, 175; 257/25, 17, 22, 28

(56) References Cited

U.S. PATENT DOCUMENTS

| | | | |
|---|---|---|---|
| 3,569,733 A | 3/1971 | Weischedel | 307/222 |
| 3,701,148 A | 10/1972 | Frei | 340/347 AD |
| 3,815,124 A | 6/1974 | Brewer | 340/347 AD |
| 3,889,164 A | 6/1975 | Basham | 307/268 |
| 5,132,557 A | 7/1992 | Uchida et al. | 307/352 |
| 5,272,480 A | 12/1993 | Lee | 341/133 |
| 5,313,117 A * | 5/1994 | Maezawa | 307/450 |
| 5,444,751 A | 8/1995 | Sage | 377/78 |
| 5,563,530 A | 10/1996 | Frazier et al. | 326/132 |
| 5,606,177 A * | 2/1997 | Wallace et al. | 257/25 |
| 5,698,997 A | 12/1997 | Williamson, III et al. | 326/134 |
| 5,815,008 A | 9/1998 | Williamson, III et al. | 326/134 |
| 5,869,845 A * | 2/1999 | Vander Wagt et al. | 257/25 |
| 5,874,911 A | 2/1999 | Kodama | 341/156 |
| 5,883,829 A * | 3/1999 | Vander Wagt | 365/174 |
| 5,930,323 A | 7/1999 | Tang et al. | 377/77 |
| 5,953,249 A * | 9/1999 | Vander Wagt | 365/72 |
| 6,037,819 A | 3/2000 | Broekaert | 327/291 |
| 6,229,468 B1 | 5/2001 | Broekaert | 341/133 |
| 6,292,118 B1 | 9/2001 | Broekaert | 341/133 |
| 6,343,887 B1 | 2/2002 | Broekaert | 341/155 |
| 6,366,226 B2 | 4/2002 | Broekaert | 341/133 |
| 6,366,229 B2 | 4/2002 | Broekaert | 341/155 |

FOREIGN PATENT DOCUMENTS

| | | | |
|---|---|---|---|
| DE | 27 55 228 A1 | 6/1979 | H03C/1/54 |
| SU | 1370758 A1 | 1/1988 | H03K/5/24 |

OTHER PUBLICATIONS

Mir, S., et al, "Unified Built–In Self–Test for Fully Differential Analog Circuits", Journal of Electronic Testing: Theory and Applications 9, 135–151 (1996), 1996 Kluwer Academic Publishers.

Sen–Jung Wei, et al, "A Self–Latching A/D Converter Using Resonant Tunneling Diodes", IEEE Journal of Solid–State Circuits, vol. 28, No. 6, Jun. 1993, pp. 697–700.

Takumi Miyashita, et al., "5 GHz E) Analog–to–Digital Converter with Polarity Alternating Feedback Comparator", IEEE Gallium Arsenide Integrated Circuit Symposium, pp. 91–94, 1997.

Kleks, J., "A 4–Bit Single Chip Analog to Digital Converter with A 1.0 Gigahertz Analog Input Bandwidth", IEEE Gallium Arsenide Integrated Circuit Symposium, pp. 79–82, 1987.

Baskin, H.B., "N–Valued Logic–Circuit", IBM Technical Disclosure Bulletin, XP–002138968, vol. 3, No. 10, Mar. 1961—p. 81.

Sun, C.K., et al, "A Bridge Type Optoelectronic Sample and Hold Circuit", 1991 IEEE International Symposium on Circuits and Systems, Singapore, Jun. 11–14, 1991, cover and p. 3003–3006.

Fushimi, Kazuo, "Pulse Circuits Using Esaki Diodes", Electronics and Communications in Japan, vol. 47, No. 4, Apr. 1964, XP–000907071, pp. 142–152, Scripta Technica, Ny, US.

* cited by examiner

Primary Examiner—Vu A. Le
(74) Attorney, Agent, or Firm—Baker Botts L.L.P.

(57) ABSTRACT

A negative differential resistance device is provided that includes a first barrier, a second barrier and a third barrier. A first quantum well is formed between the first and second barriers. A second quantum well is formed between the second and third barriers.

17 Claims, 2 Drawing Sheets

FORMING AND STORING DATA IN A MEMORY CELL

TECHNICAL FIELD OF THE INVENTION

This invention relates generally to digital memory and more particularly to a method and system for generating a memory cell.

BACKGROUND OF THE INVENTION

As microprocessors and other electronics applications become faster, storing and accessing data at increasingly high speeds presents more of a challenge. Generally, static random access memories (SRAMs) have been able to operate at higher speeds than dynamic random access memories (DRAMs). In addition, unlike DRAM cells, SRAM cells do not need to be refreshed. This conserves power and makes them continuously available for reading and writing data. However, DRAMs generally are less expensive than SRAMs and are available at densities several times higher than SRAMs. Therefore, conventional memory cells are unable to provide on-chip data storage that includes a combination of high speed, low power, low cost and high density characteristics.

SUMMARY OF THE INVENTION

In accordance with the present invention, a method and system for generating a memory cell are provided that substantially eliminate or reduce the disadvantages or problems associated with previously developed systems.

In one embodiment of the present invention, a negative differential resistance device is provided that includes a first barrier, a second barrier and a third barrier. A first quantum well is formed between the first and second barriers. A second quantum well is formed between the second and third barriers.

In another embodiment of the present invention, a memory cell is provided that includes a data storage operable to store a piece of data. The data storage includes a first negative differential resistance device and a second negative differential resistance device. The first and second negative differential resistance devices operate at a low current density. The memory cell includes an access device for accessing the piece of data stored in the data storage.

Technical advantages of the present invention include providing an improved method and system for generating a memory cell. In particular, a double quantum well resonant tunneling diode is included as a part of the memory cell. Accordingly, the low power characteristics of a conventional SRAM cell and the low cost and high density of a conventional DRAM cell are provided together in a new memory cell. In addition, the improved memory cell allows relaxation of transistor leakage requirements. This allows the use of faster, leakier transistors than those normally used in DRAM cells, yielding a higher speed cell.

Other technical advantages of the present invention will be readily apparent to one skilled in the art from the following figures, descriptions and claims.

BRIEF DESCRIPTION OF THE DRAWINGS

For a more complete understanding of the present invention and its advantages, reference is now made to the following description taken in conjunction with the accompanying drawings, in which like reference numerals represent like parts and wherein.

DETAILED DESCRIPTION OF THE INVENTION

Figure 1:
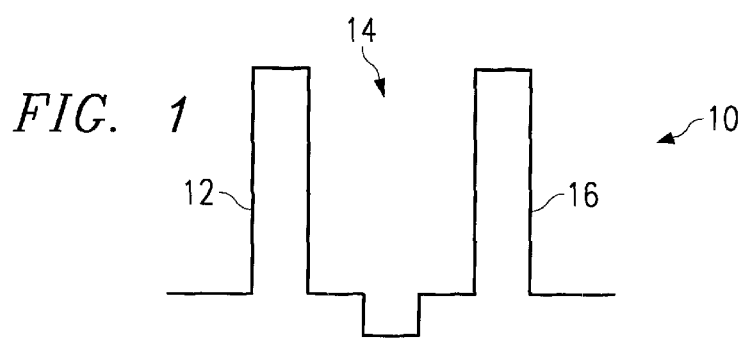
FIG. 1 is a conduction band diagram of a single quantum well resonant tunneling diode (SRTD)

FIG. 1 is a schematic diagram of a single quantum well resonant tunneling diode (SRTD) 10. The SRTD 10 comprises a first barrier 12, a quantum well 14 and a second barrier 16. In operation, an input voltage is applied to the first barrier 12 and an output current flows from the second barrier 16. When a low amplitude voltage is applied to the first barrier 12, almost no electrons tunnel through both the first barrier 12 and the second barrier 16. This results in a negligible output current and the SRTD 10 is switched off.

As the voltage increases, the energy of the electrons at the first barrier 12 also increases and the wavelength associated with these electrons decreases. This occurs because an electron's wavelength is determined by dividing Planck's constant by the electron's momentum. When a particular voltage level is reached at the first barrier 12, a specific number of electron wavelengths will fit within the quantum well 14. At this point, resonance is established as electrons that tunnel through the first barrier 12 remain in the quantum well 14, giving those electrons opportunities to tunnel through the second barrier 16. Thus, a current flow is established from the first barrier 12 to the second barrier 16 and the SRTD 10 is switched on. However, if the voltage level continues to rise, eventually no electrons will resonate at the proper wavelength to tunnel through the first barrier 12 and the second barrier 16. In this case, the SRTD 10 is switched off. Generally, this property of an SRTD 10 that allows switching back and forth between on and off states as the voltage increases enables biasing of the SRTD 10 for operation in one of three stable states, as illustrated in FIG. 2.

Figure 2:
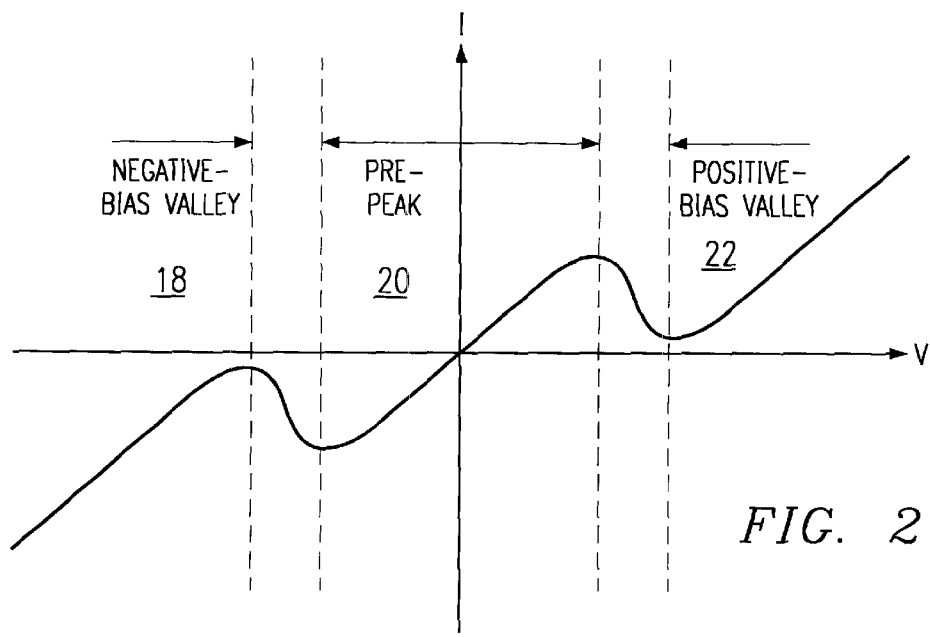
FIG. 2 is a graph of current as a function of voltage for the SRTD illustrated in FIG. 1.

FIG. 2 is a graph showing current as a function of voltage for the SRTD 10. The shape of this I-V curve is determined by the quantum effects that are the result of the extreme thinness of the first barrier 12, the quantum well 14 and the second barrier 16, each of which are approximately 10–20 atoms thick. As discussed above in connection with FIG. 1, the SRTD 10 may be biased to operate in one of three stable states. These states are the negative-bias valley region 18, the pre-peak region 20, and the positive-bias valley region 22.

SRTDs 10 are generally operated in one of the stable states 18, 20 or 22 and at a high current density. However, some applications require a device that operates at a low current density. To lower the operating current density for an SRTD 10, the thickness of barriers 12 and 16 is increased. However, the thicker the barriers 12 and 16 become, the more the corresponding I-V curve flattens until the SRTD 10 eventually no longer has the desired characteristics of a negative differential resistance device. Thus, an inherent lower limit exists on the operating current density for an SRTD 10 that exhibits negative differential resistance characteristics.

According to one embodiment of the present invention, a resonant tunneling diode is constructed with two quantum wells. This allows the device to retain its negative differential resistance characteristics while operating at a lower current density, as described below in connection with FIGS. 3 and 4.

Figure 3:
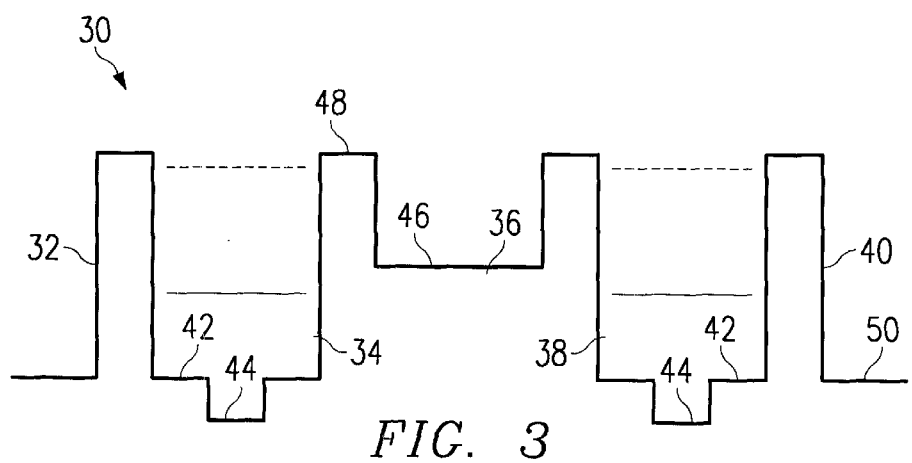
FIG. 3 is a conduction band diagram of a double quantum well resonant tunneling diode (DRTD) constructed in accordance with the teachings of the present invention.

FIG. 3 is a schematic diagram of a double quantum well resonant tunneling diode (DRTD) 30 constructed in accordance with the teachings of the present invention. The DRTD 30 comprises a first barrier 32, a first quantum well 34, a second barrier 36, a second quantum well 38 and a third barrier 40. The DRTD 30 operates similarly to the SRTD 10. With a low magnitude voltage applied to the first barrier 32, almost no electrons tunnel through the barriers 32, 36 and 40, resulting in negligible output current. When the voltage reaches a particular level, resonance is established as electrons that tunnel through the first barrier 32 remain in the first quantum well 34, giving those electrons opportunities to tunnel through the second barrier 36 into the second quantum well 38. From the second quantum well 38, the electrons have an opportunity to tunnel through the third barrier 40, resulting in a current flow that switches the DRTD 30 on. As with the SRTD 10, if the voltage level continues to rise, eventually the DRTD 30 switches back off.

According to one embodiment, the first barrier 32 and the third barrier 40 each comprise a layer of aluminum arsenide that is approximately 3 nm thick. The first quantum well 34 and the second quantum well 38 each comprise a well base 42 and a recess 44. The well base 42 comprises a layer of indium gallium arsenide that is approximately 5 nm thick from the first barrier 32 to the second barrier 36 and from the second barrier 36 to the third barrier 40. The recess 44 is substantially centered within the well base 42 and comprises a layer of indium arsenide that is approximately 3 nm thick.

The second barrier 36 comprises a barrier base 46 and two posts 48. If the second barrier 36 is too thin, the DRTD 30 essentially becomes a triple-barrier resonant tunneling diode that behaves similarly to an SRTD 10. In this situation, the advantage of lower current density operation that is possible with a DRTD 30 is lost. Thus, the barrier base 46 comprises a layer of indium aluminum arsenide that is approximately 5 nm thick. The posts 48 each comprise a layer of aluminum arsenide that is approximately 3 nm thick. The DRTD 30 typically is formed on a substrate 50 comprising a layer of indium gallium arsenide that is approximately 500 nm thick.

It will be understood, however, that the barriers 32, 36 and 40, the quantum wells 34 and 38, and the substrate 50 may comprise any other suitable materials. For example, in one embodiment, the materials of the first and third barriers 32 and 40 and the posts 48 are not lattice-matched to the materials of the substrate 50 and the well base 42. This provides an improved peak-to-valley ratio for the DRTD 30. In addition, the material of the barrier base 46 is lattice-matched to the materials of the substrate 50 and the well base 42. This allows the second barrier 36 to be relatively thick, whereas the thickness of a barrier comprising non-lattice-matched material would be limited by the resulting strain.

Figure 4:
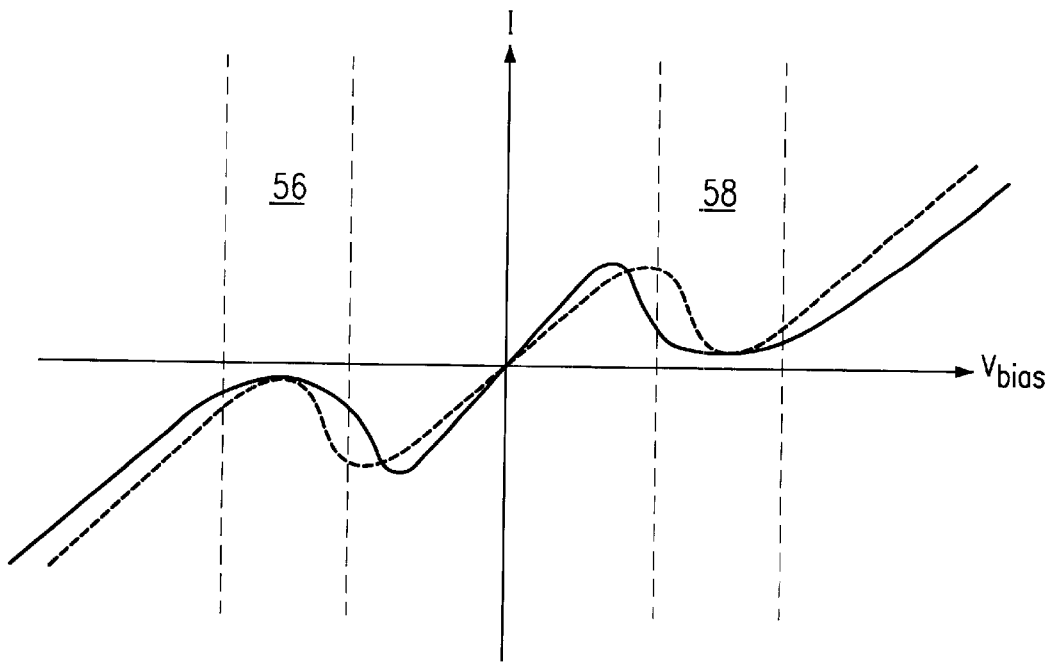
FIG. 4 is a graph of current as a function of voltage for the DRTD illustrated in FIG. 3.

FIG. 4 is a graph of current as a function of voltage for the DRTD 30. The dotted line on this graph corresponds to the I-V curve of the SRTD 10, as illustrated in FIG. 2. As illustrated in FIG. 4, the peak voltage associated with the DRTD 30 is lower than the peak voltage associated with the SRTD 10 and, as previously discussed, the peak may be absent for the SRTD 10 at sufficiently low current densities. In addition to this difference, the DRTD 30 has a wide negative valley 56 and a wide positive valley 58 for operation of the DRTD 30 at a low current density. The corresponding valleys for the SRTD 10 are narrower and, as discussed above in connection with FIG. 2, the SRTDs 10 are not generally operated in those valleys. Thus, the DRTD 30 provides a lower peak voltage and wider valleys 56 and 58 for low current operation.

Figure 5:
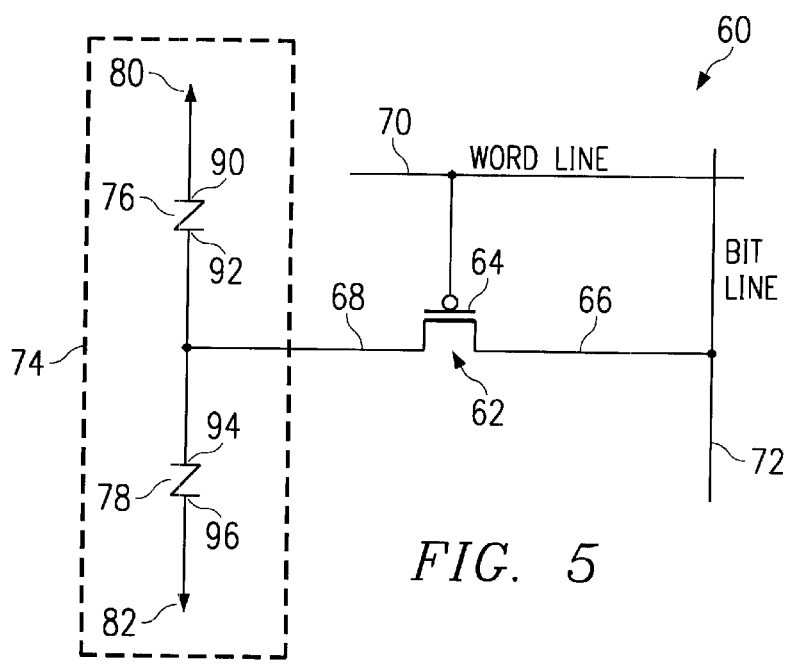
FIG. 5 is a circuit diagram illustrating a static memory cell constructed in accordance with one embodiment of the present invention.

FIG. 5 is a circuit diagram illustrating a static memory cell 60 constructed in accordance with one embodiment of the present invention. The memory cell comprises a transistor 62 with a gate 64, drain 66 and source 68. According to one embodiment, the transistor 62 is a heterostructure field effect transistor. It will be understood, however, that other types of transistors or other suitable access devices may be used without departing from the scope of the present invention. The transistor 62 is associated with one bit of data that may be accessed by activating a corresponding word line 70 and bit line 72. The gate 64 is coupled to the word line 70 and the drain is coupled to the bit line 72. The bit of data that is associated with the transistor 62 is stored in a bit storage 74 that is coupled to the source 68 of the transistor 62.

The bit storage 74 of the present invention comprises a first DRTD 76, a second DRTD 78, a first power supply terminal 80 and a second power supply terminal 82. The first DRTD 76 has a first terminal 90 coupled to the first power supply terminal 80 and a second terminal 92 coupled to the source 68 of the transistor 62. The second DRTD 78 has a first terminal 94 coupled to the source 68 of the transistor 62 and a second terminal 96 coupled to the second power supply terminal 82. According to an alternative embodiment, one of the DRTDs 76 or 78 may be coupled to ground instead of to a power supply terminal 80 or 82.

In a conventional DRAM cell, the bit storage 74 is a capacitor that stores a voltage corresponding to a bit value. The capacitor must be continually refreshed as the stored voltage leaks from the capacitor. In contrast, the present invention provides a bit storage 74 that produces a current to compensate for the leakage current through the transistor 62, thereby minimizing the need for the bit storage 74 to be refreshed.

The devices used in the bit storage 74 are operated at a low current density. A low current density is a current density substantially equal to the relatively low leakage current of the transistor 62 such that the low current density compensates for the leakage current while reducing power requirements by minimizing excess current. Therefore, DRTDs 76 and 78, which are capable of operating at a low current density, are preferably used in this memory cell 60 instead of SRTDs 10.

If the difference between the peak and valley currents associated with the DRTDs 76 and 78 is higher than the leakage current of the transistor 62, the DRTDs 76 and 78 are able to compensate for the current leaking from the transistor 62. In this situation, the DRTDs 76 and 78 provide a continuous, local refresh to the memory cell 60, making it static instead of dynamic.

The DRTDs 76 and 78 tend to have both a low peak and a low valley current, and the peak current is insufficient to directly drive the bit line 72 during a read operation. Thus, the bit storage 74 of the present invention is accessed in a similar manner as a conventional DRAM cell, where the combined capacitance of the DRTDs 76 and 78, instead of an explicitly added capacitor, drives the bit line 72. However, it will be understood that the bit storage 74 may also comprise a capacitor without departing from the scope of the present invention.

Another property associated with the use of DRTDs 76 and 78 in the memory cell 60 relates to switching speed. Because of the short distance an electron must travel from the first barrier 32 through third barrier 40, the DRTDs 76 and 78 have the ability to switch on and off at a very high rate. This potential can be exploited if the DRTDs 76 and 78 have a high peak current while at the same time having a low valley current. In that case, the direct DRTD current drive, instead of merely the cell capacitance, can be used to obtain SRAM-type high-speed sensing during the read operation.

For the DRTDs 76 and 78 to function properly, the power supply terminals 80 and/or 82 should provide at least twice as much voltage as the peak voltage of the DRTDs 76 and 78. Therefore, the lower current density and reduced peak voltage associated with the DRTDs 76 and 78, as compared to a conventional SRTD 10, also provide the benefit of allowing the use of lower voltage power supplies. In addition, because the power provided by the power supplies is lower than the power required to refresh a DRAM cell, the memory cell 60 has reduced power requirements as compared to a conventional DRAM cell.

Additionally, because the valley current is generally much less than the peak current in the DRTDs 76 and 78, the memory cell 60 functions as a self-adjusting leakage compensating circuit. Thus, instead of needing to provide equal power to each cell 60 based on estimations of the maximum leakage current, each cell 60 may consume a different amount of current according to individual cell requirements. This substantially reduces the standby power requirements of a circuit utilizing a large number of memory cells 60.

In one embodiment of the present invention, the I-V curves for the DRTDs 76 and 78 are symmetric to achieve a more compact design for the memory cell 60. To achieve this symmetry, the current in the DRTD 76 flows from the first terminal 90, through the DRTD 76, to the second terminal 92 connected to the source 68 of the transistor 62. In the DRTD 78, the current flows from the second terminal 96, through the DRTD 78, to the first terminal 94 connected to the source 68 of the transistor 62.

Therefore, the use of DRTDs 76 and 78 in the bit storage 74 of the present invention results in a memory cell 60 that provides high speed and requires low power due to the low current density operation of the DRTDs 76 and 78. Low cost and high density are also provided due to the layout of and relatively few components in the memory cell 60. In addition, the memory cell 60 allows transistor leakage requirements to be relaxed, as the DRTDs 76 and 78 may be designed to compensate for more transistor leakage than would be acceptable in a conventional DRAM cell.

Although the present invention has been described with reference to several embodiments, various changes and modifications may suggest themselves to one skilled in the art. It is intended that the present invention encompass such changes and modifications as fall within the scope of the appended claims.

What is claimed is:

1. A memory cell for storing data, comprising:
   a data storage comprising a first double quantum well resonant tunneling diode and a second double quantum well resonant tunneling diode, the first and second double quantum well resonant tunneling diodes operating at a low current density; and
   an output circuit connected to the data storage for accessing the data stored in the data storage.

2. The memory cell of claim 1, wherein the output circuit comprises a transistor.

3. The memory cell of claim 2, wherein the transistor comprises a heterostructure field effect transistor.

4. The memory cell of claim 1, wherein the first and second double quantum well resonant tunneling diodes each comprise:
   a first barrier;
   a second barrier;
   a first quantum well formed between the first and second barriers;
   a third barrier; and
   a second quantum well formed between the second and third barriers.

5. A method for forming a memory cell, comprising:
   providing a first double quantum well resonant tunneling diode having a first terminal and a second terminal;
   providing a second double quantum well resonant tunneling diode having a first terminal and a second terminal;
   providing an access device having a storage terminal and an access terminal;
   coupling the second terminal of the first double quantum well resonant tunneling diode to the storage terminal of the access device; and
   coupling the first terminal of the second double quantum well resonant tunneling diode to the storage terminal of the access device.

6. The method of claim 5, further comprising:
   coupling the first terminal of the first double quantum well resonant tunneling diode to a power supply; and
   coupling the second terminal of the second double quantum well resonant tunneling diode to a power supply.

7. The method of claim 5, further comprising:
   coupling the first terminal of the first double quantum well resonant tunneling diode to a power supply; and
   grounding the second terminal of the second double quantum well resonant tunneling diode.

8. The method of claim 5, further comprising coupling a bit line to the access terminal of the access device.

9. The method of claim 5, wherein the access device further comprises a word terminal and further comprising coupling a word line to the word terminal of the access device.

10. The method of claim 5, wherein the access device comprises a transistor.

11. A method for storing data, comprising:
   storing data in a data storage comprising a first double quantum well resonant tunneling diode coupled to a second double quantum well resonant tunneling diode;
   coupling an access device to the data storage;
   receiving the data at the access device; and
   storing the data received at the access device in the data storage.

12. The method of claim 11, further comprising:
   coupling the first double quantum well resonant tunneling diode to a power supply; and
   coupling the second double quantum well resonant tunneling diode to a power supply.

13. The method of claim 11, further comprising:
   coupling the first double quantum well resonant tunneling diode to a power supply; and
   grounding the second double quantum well resonant tunneling diode.

14. The method of claim 11, wherein the access device comprises a transistor.

15. A method for storing data in a memory cell, comprising:
   providing a first negative differential resistance device having a first terminal and a second terminal;
   providing a second negative differential resistance device having a first terminal and a second terminal;
   providing an access device having a storage terminal and an access terminal;
   coupling the second terminal of the first negative differential resistance device to the storage terminal of the access device; and
   coupling the first terminal of the second negative differential resistance device to the storage terminal of the access device.

16. The method of claim 5 further comprising:
   operating the first and second double quantum well resonant tunneling diodes at a low current density, the current density substantially equal to the leakage current of the access device.

17. The method of claim 5 further comprising:
   operating the first and second double quantum well resonant tunneling diodes to achieve symmetric current-voltage curves.

* * * * *

UNITED STATES PATENT AND TRADEMARK OFFICE
CERTIFICATE OF CORRECTION

PATENT NO.    : 6,490,193 B1
DATED         : December 3, 2002
INVENTOR(S)   : Jan Paul van der Wagt et al.

It is certified that error appears in the above-identified patent and that said Letters Patent is hereby corrected as shown below:

<u>Column 8,</u>
Lines 1-16, delete Claim 15 and insert:
15. The method of claim 5 further comprising:
   operating the first and second double quantum well resonant tunneling diodes
   to compensate for leakage current through the access device.

Signed and Sealed this

Twenty-fourth Day of June, 2003

JAMES E. ROGAN
*Director of the United States Patent and Trademark Office*